United States Patent
Torres

(10) Patent No.: US 6,577,172 B2
(45) Date of Patent: Jun. 10, 2003

(54) DRIVER CIRCUIT FOR A POWER ELEMENT CONNECTED TO AN INDUCTIVE LOAD

(75) Inventor: Antonino Torres, Palermo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/036,336

(22) Filed: Dec. 26, 2001

(65) Prior Publication Data

US 2002/0105313 A1 Aug. 8, 2002

(30) Foreign Application Priority Data

Dec. 29, 2000 (IT) .......................................... MI00A2867

(51) Int. Cl.⁷ ................................................. H03B 1/00
(52) U.S. Cl. ...................................... 327/110; 361/91.2
(58) Field of Search .............................. 327/110, 108, 327/377, 379, 383, 435, 434, 439, 440, 441, 539, 540; 363/56.12; 361/91.1, 91.2, 91.7, 93.9

(56) References Cited

U.S. PATENT DOCUMENTS 6,100,728 A  *  8/2000  Shreve et al. ................ 327/110
6,429,701 B2 *  8/2002  Karaki et al. ................ 327/110

* cited by examiner

Primary Examiner—Shawn Riley
(74) Attorney, Agent, or Firm—Allen, Dyer, Doppelt, Milbrath & Gilchrist, P.A.; Lisa K. Jorgenson

(57) ABSTRACT

A driver circuit drives a power element connected to an inductive load. The driver circuit includes an input terminal coupled to a control terminal of the power element through a trigger block, and a voltage regulator block having a circuit node coupled to a first supply voltage reference, as well as to a second supply voltage reference through a capacitor. A voltage comparator stage includes an operational amplifier having an inverting input connected to the circuit node and a non-inverting input is connected directly to a terminal of the power element, such as to the emitter terminal thereof. The operational amplifier also includes an output connected to the control terminal of the power element.

20 Claims, 4 Drawing Sheets

DRIVER CIRCUIT FOR A POWER ELEMENT CONNECTED TO AN INDUCTIVE LOAD

FIELD OF THE INVENTION

The present invention relates to a driver circuit for a power element connected to an inductive load. More particularly but not exclusively, the driver circuit is for an IGBT power transistor which incorporates a Zener diode, and the detailed description that follows covering this field of application is for convenience of explanation only.

BACKGROUND OF THE INVENTION

As is well known, inductive loads, like coils, are usually associated with a suitable power element enabling them to be driven. A driver circuit is then associated with the power element. In case of malfunctions or power blackout, the consequent overvoltage across the primary windings of a coil need to be controlled to prevent coil damages.

A prior approach to meeting this requirement is illustrated in FIG. 1. This figure shows a driver circuit 20 for a power element 2. The driver circuit 20 comprises basically a trigger block 3, a voltage regulator block 4, and a buffer stage 5. The circuit 20 has an input terminal IN coupled to the trigger block 3 to receive a triggering signal TRIGGER. The circuit also has an output terminal OUT connected to a control terminal B of the power element 2. The output terminal OUT is connected to the output of the trigger block 3, which includes a gate resistor Rg.

The buffer stage 5 of the circuit 20 is supplied a first supply voltage reference BATTERY, and includes an operational amplifier 6 whose output OUT1 is fed back to its inverting (−) input. The output OUT1 is coupled to the control terminal B of the power element 2 through a switch SW3.

The amplifier 6 is connected with its non-inverting (+) input to a circuit node IN4. This node is coupled to the first supply voltage reference BATTERY through a switch SW2 and a resistor R1 connected in series, and coupled to a second supply voltage reference GND through a capacitor C. This capacitor C is a part of the regulator block 4, and is connected in a network that further includes a generator G for generating a current Id, and a switch SW1 for connecting the generator G in parallel with the capacitor C.

Plotted against time in FIG. 2 are typical waveforms of current and voltage signals of the driver circuit of FIG. 1, according to the prior art. In particular, the waveforms of trigger signals, a voltage Vcap measured across the capacitor C, and a current Icoll flowing through the power element 2 are shown.

It will be seen, in particular, that the patterns of the voltage and current signals from a time Tx onwards indicate a malfunction situation. At the time Tx, switch SW2 opens at the same time as switches SW1 and SW3 are closed. A driving voltage is applied to the control terminal B of the power element which decreases linearly in time to zero. Accordingly, the power element will be forced to operate with a decreasing output current to zero.

Although advantageous on several counts, this prior approach still has a significant drawback in that the time taken by the current that is flowing through the power element to become null cannot be controlled with any degree of accuracy, because its pattern is dependent on the characteristics of the power elements.

SUMMARY OF THE INVENTION

The underlying technical problem of this invention is to provide a driver circuit adapted, in case of malfunctions, to discontinue the coil drive for a sufficiently long time to avoid overshooting at the primary winding and a consequential unwanted sparking at the secondary, and this is irrespective of the characteristics of the power element being used, thereby overcoming the limitations and/or drawbacks associated with driver circuits according to the prior art.

The principle on which this invention stands is one of monitoring the variation of the current flowing through the power element with respect to time by direct control of the current that flows through a conduction terminal of the power element.

Based on this principle, the technical problem is solved by a driver circuit as previously indicated being characterized in that it comprises a voltage comparator stage having a first input connected to the circuit node, a second input connected directly to a conduction terminal of the power element, and an output connected to the control terminal of the power element.

BRIEF DESCRIPTION OF THE DRAWINGS

The features and advantages of the driver circuit according to this invention will be apparent from the following detailed description of an embodiment thereof, given by way of a non-limiting example with reference to the accompanying drawings.

DETAILED DESCRIPTION OF THE PREFERRED EMBODIMENTS

Figure 3:
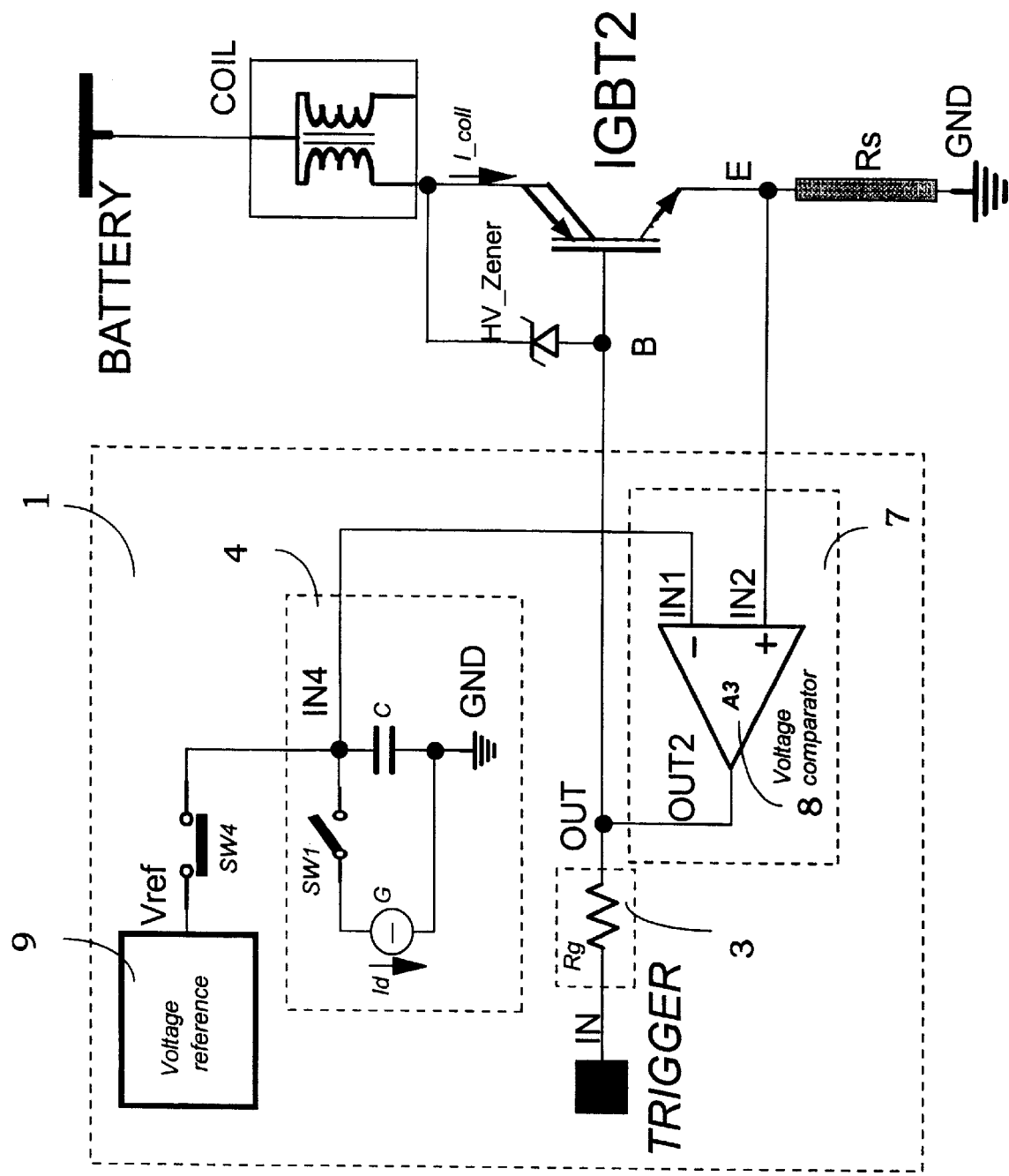
FIG. 3 shows schematically a driver circuit for a power element according to the invention.

FIG. 3 shows generally a driver circuit 1 according to this invention, in schematic form. Parts that have the same structure and operate in the same way as in the example of FIG. 1 will be denoted by the same reference numerals throughout this description. The driver circuit 1 has an input terminal IN of a trigger block 3 to receive a triggering signal TRIGGER, and has an output terminal OUT connected to a control terminal B of a power element 2. The trigger block 3 includes a gate resistor Rg.

Advantageously in this invention, the circuit includes a voltage comparator stage 7 comprising an operational amplifier 8 whose first or inverting input IN1 is connected to the circuit node IN4 of the voltage regulating block 4, and a second or non-inverting input IN2 is connected directly to a terminal of the power element 2. In particular, the second input IN2 is connected to the emitter terminal E of the IGBT transistor. Advantageously, this emitter terminal E is connected through a sensing resistor Rs to the second supply voltage reference GND that provides a ground reference.

The comparator 7 has an output OUT2 connected directly to the control terminal B of the power element 2. The circuit node IN4 is again part of the regulator block 4, and is connected to the second voltage reference GND through a capacitor C. This capacitor is connected in a network that also includes a generator G for generating a current Id, and a switch SW1. The switch SW1 in its closed state connects the generator G in parallel with the capacitor C.

Advantageously, according to the invention, the circuit node IN4 is coupled to a reference voltage generator 9 through a switch SW4. The generator 9 may be a stable band-gap reference, and the reference voltage Vref provided by the generator 9 may be lower than the first supply voltage reference BATTERY.

Figure 4:
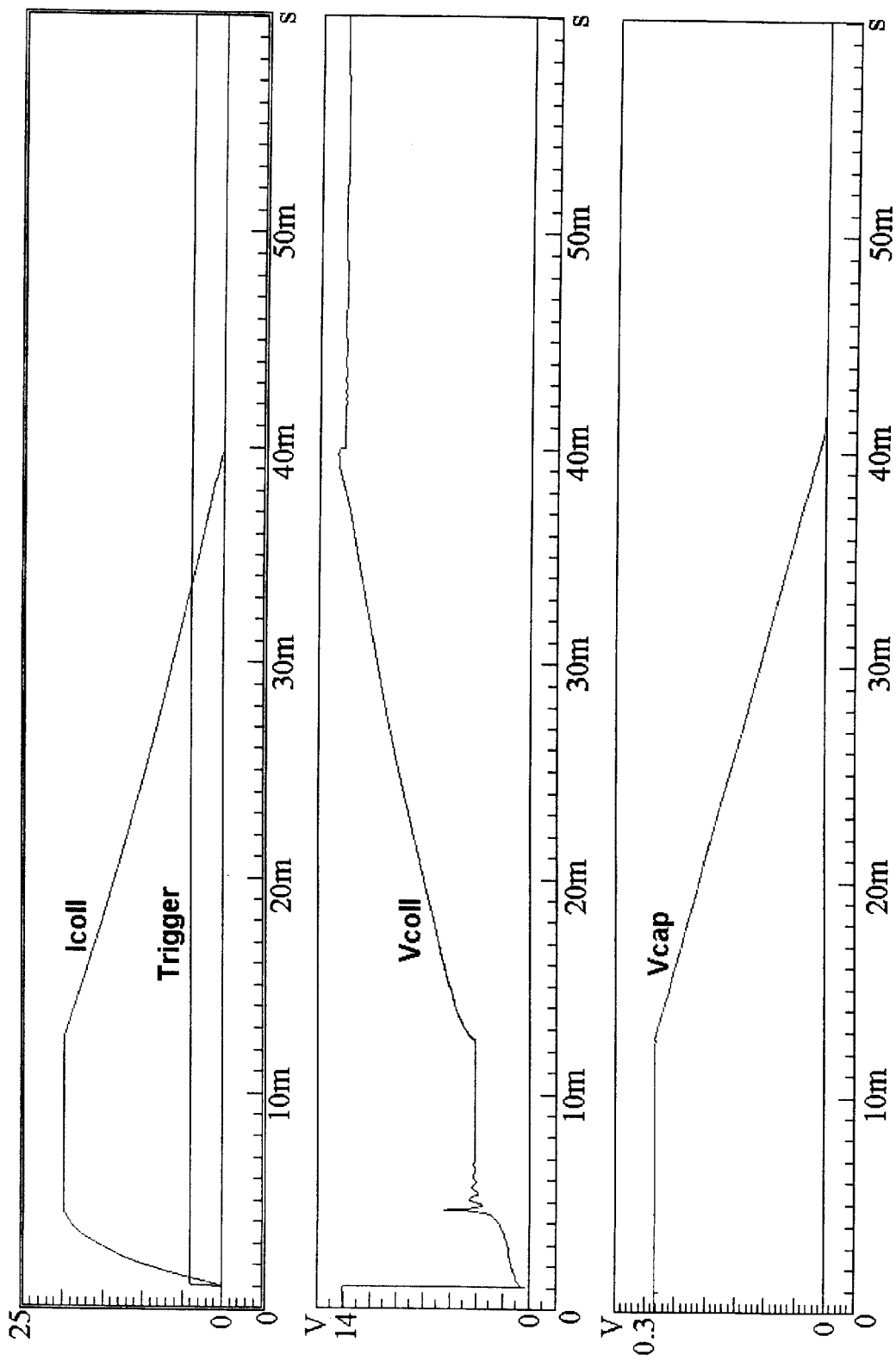
FIG. 4 is a plot against time of internal signals of the driver circuit shown in FIG. 3.

Plotted against time in FIG. 4 are signals issuing from a system that is using the driver circuit according to the invention, wherein an IGBT provides the power element and a coil is used that has a primary inductance of 1 mH and a resistance of 0.5 Ohms. In particular, plotted against time are the emitter current and voltage, respectively designated Icoll and Vcoll, and the voltage Vcap of the capacitor C. These signals are generated upon a trigger signal, also shown, going high.

The operation of the driver circuit 1 according to the invention will now be described. In normal operation, the switch SW1 would be open and the switch SW4 would be closed to hold the capacitor C charged at a reference voltage value Vref. The latter is provided by the reference voltage generating block 9.

The operational amplifier 8 operates essentially as a current limiter. When the collector current Icoll of the power element 2 generates—across the sensing resistor Rs connected to the emitter E of the power element—a voltage Ve equal to the reference voltage Vref at the inverting input of the amplifier 8, a signal is produced on the output OUT2 to bias the control terminal B of the power element in such a way that the current Icoll cannot exceed a maximum value given as:

$$Icm = Vref/Rs$$

where Icm is the maximum value foreseen for the collector current Icoll.

If an anomalous behavior is detected at a time tx, and the protection system is triggered on, the system would act to close the switch SW1 and open the switch SW4. The capacitor C then begins to be discharged at a constant current Id, and the voltage across it decreases linearly down to zero from its initial value Vcap=Vref.

Figure 1:
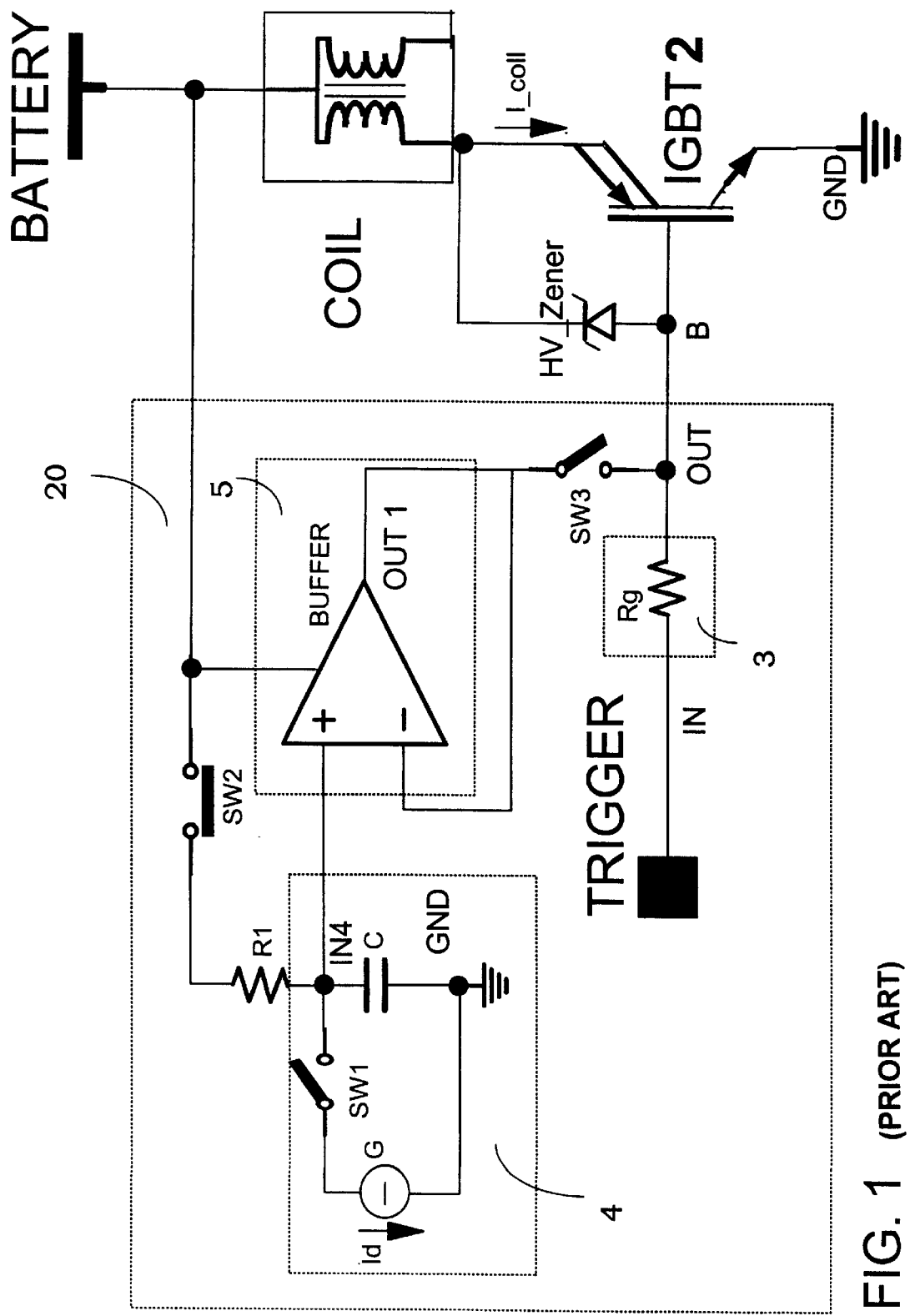
FIG. 1 shows schematically a driver circuit for a power element according to the prior art.
Figure 2:
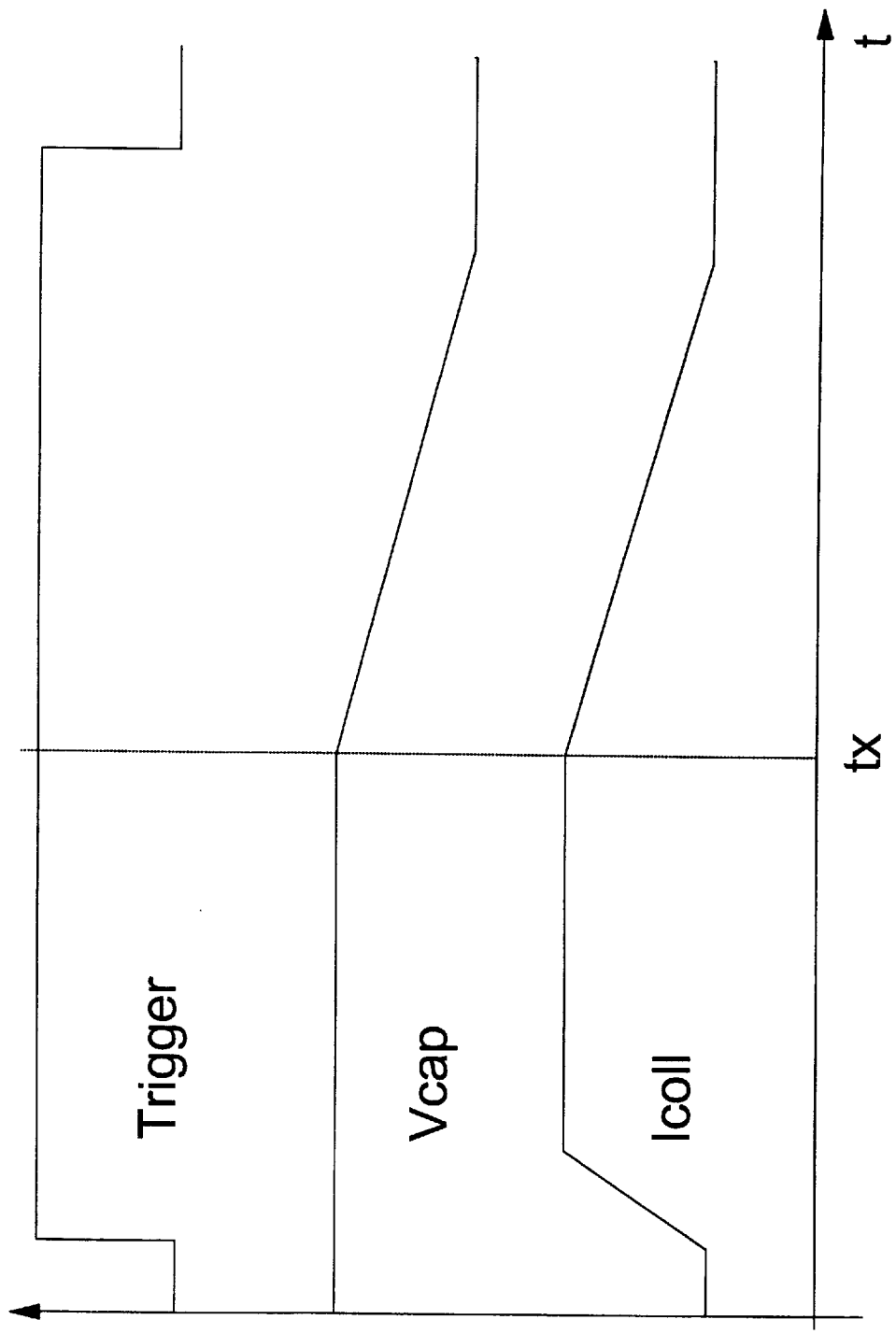
FIG. 2 is a plot against time of internal signals of the driver circuit shown in FIG. 1.

Similar as in the prior art circuit shown in FIG. 1, the protection system allows the capacitor C to be discharged at the time tx, and for a sufficiently long time to prevent overshooting at the primary. Unlike what occurs in the prior art circuit, however, the linearly tapering voltage is effective in the circuit according to the invention shown in FIG. 3, to modify the reference voltage Vref at the inverting input of the operational amplifier 8.

Thus, the following relations apply:

$$Vcap(t) = Vref \quad t \leq tx$$

$$Vcap(t) = Vref - (Id/C)(t-tx) \quad t > tx.$$

An operational amplifier used as a voltage comparator is known to operate such that both its inputs are held at the same potential. In this case, it will bias the control terminal of the power element such that its output current will establish a voltage across the resistor Rs which has the same pattern as the voltage Vcap across the capacitor. Since, $$Ic(t) = Vcap(t)/Rs,$$

It follows that:

$$dIc(t)/dt = -Id/C * 1/Rs \text{ when } t > tx.$$

Therefore, the variation of the collector current with respect to time will be constant and only dependent on the discharge current Id from the capacitor C, the capacitance value of the capacitor C, and the resistance value of the sensing resistor Rs, and is in no way influenced by the characteristics of the power element employed.

To summarize, the driver circuit 1 according to the invention provides for a protection system for power devices used for driving inductive loads, preventing unacceptable overshooting from occurring during the turn-off phase. The individual characteristics of the power elements employed bear no influence on the protection provided. This protection system can also be used with a bipolar power transistor. In this case, the transistor would be current—rather than voltage—driven as in the non-limitative embodiment described above.

That which is claimed is:

1. A driver circuit for a power element coupled to an inductive load, the driver circuit comprising:
    a trigger block having an input, and an output coupled to a control terminal of the power element;
    a voltage regulator block having a circuit node coupled to a first supply voltage reference, and comprising a capacitor coupled between the circuit node and a second supply voltage reference; and
    a voltage comparator stage having a first input coupled to the circuit node, a second input coupled to a conduction terminal of the power element, and an output coupled to the output of said trigger block and to the control terminal of the power element.

2. A circuit according to claim 1, wherein the power element comprises an IGBT transistor, and the IGBT transistor comprises an emitter terminal corresponding to the conduction terminal of the power element.

3. A circuit according to claim 2, further comprising a sensing resistor coupled between the emitter terminal and the second supply voltage reference.

4. A circuit according to claim 1, further comprising:
    a generator for providing a reference voltage; and
    a switch coupled between said generator and the circuit node.

5. A circuit according to claim 4, wherein said generator comprises a band-gap reference.

6. A circuit according to claim 1, wherein said voltage comparator stage comprises an operational amplifier, said operational amplifier having an inverting input corresponding to the first input, a non-inverting input corresponding to the second input and an output corresponding to the output of said voltage comparator stage.

7. A driver circuit for an IGBT transistor comprising a collector coupled to an inductive load and an emitter coupled to a sensing resistor, the driver circuit comprising:
    a trigger block having an input, and an output coupled to a base of the IGBT transistor;
    a voltage regulator block having a circuit node coupled to a first supply voltage reference, and comprising a capacitor coupled between the circuit node and a second supply voltage reference; and
    an operational amplifier having an inverting input coupled to the circuit node, a non-inverting input coupled to a common node between the emitter of the IGBT transistor and the sensing resistor, and an output coupled to the output of said trigger block and to a base of the IGBT transistor.

8. A circuit according to claim 7, further comprising:
    a generator for providing a reference voltage; and a switch coupled between said generator and the circuit node.

9. A circuit according to claim 8, wherein said generator comprises a band-gap reference.

10. A circuit according to claim 7, wherein the sensing resistor is coupled to the second supply voltage reference.

11. A circuit comprising:
an inductive load;
a power element comprising a first conduction terminal coupled to said inductive load;
a sensing resistor coupled to a second conduction terminal of said power element; and
a driver circuit for driving said power element and comprising
a trigger block having an input, and an output coupled to a control terminal of the power element,
a voltage regulator block having a circuit node coupled to a first supply voltage reference, and comprising a capacitor coupled between the circuit node and a second supply voltage reference, and
a voltage comparator stage having a first input coupled to the circuit node, a second input coupled to the second conduction terminal of the power element, and an output coupled to the output of said trigger block and to the control terminal of the power element.

12. A circuit according to claim 11, wherein the power element comprises an IGBT transistor, and the IGBT transistor comprises an emitter terminal corresponding to the second conduction terminal of the power element.

13. A circuit according to claim 11, further comprising:
a generator for providing a reference voltage; and
a switch coupled between said generator and the circuit node.

14. A circuit according to claim 13, wherein said generator comprises a band-gap reference.

15. A circuit according to claim 11, wherein said voltage comparator stage comprises an operational amplifier, said operational amplifier having an inverting input corresponding to the first input, a non-inverting input corresponding to the second input and an output corresponding to the output of said voltage comparator stage.

16. A method for forming a driver circuit for a power element coupled to an inductive load, the method comprising:
providing a trigger block having an input, and an output coupled to a control terminal of the power element;
providing a voltage regulator block having a circuit node coupled to a first supply voltage reference, the voltage regulator block comprising a capacitor coupled between the circuit node and a second supply voltage reference; and
providing a voltage comparator stage having a first input coupled to the circuit node, a second input coupled to a conduction terminal of the power element, and an output coupled to the control terminal of the power element.

17. A method according to claim 16, wherein the power element comprises an IGBT transistor, and the IGBT transistor comprises an emitter terminal corresponding to the conduction terminal of the power element.

18. A method according to claim 17, further comprising connecting a sensing resistor between the emitter terminal and the second supply voltage reference.

19. A method according to claim 16, further comprising providing a reference voltage through a switch coupled to the circuit node.

20. A method according to claim 16, wherein the voltage comparator stage comprises an operational amplifier, the operational amplifier having an inverting input corresponding to the first input, a non-inverting input corresponding to the second input and an output corresponding to the output of said voltage comparator stage.

* * * * *